(12) United States Patent
Lu et al.

(10) Patent No.: US 9,437,564 B2
(45) Date of Patent: *Sep. 6, 2016

(54) INTERCONNECT STRUCTURE AND METHOD OF FABRICATING SAME

(71) Applicant: Taiwan Semiconductor Manufacturing Company, Ltd., Hsin-Chu (TW)

(72) Inventors: Wen-Hsiung Lu, Jhonghe (TW); Hsuan-Ting Kuo, Taichung (TW); Cheng-Ting Chen, Taichung (TW); Ai-Tee Ang, Hsin-Chu (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/937,599

(22) Filed: Jul. 9, 2013

(65) Prior Publication Data

US 2015/0014851 A1 Jan. 15, 2015

(51) Int. Cl.
*H01L 23/48* (2006.01)
*H01L 23/00* (2006.01)
(Continued)

(52) U.S. Cl.
CPC ............ *H01L 24/13* (2013.01); *H01L 21/566* (2013.01); *H01L 23/3171* (2013.01); *H01L 23/3192* (2013.01); *H01L 24/05* (2013.01); *H01L 24/11* (2013.01); *H01L 2224/02331* (2013.01); *H01L 2224/0401* (2013.01); *H01L 2224/05008* (2013.01); *H01L 2224/05547* (2013.01); *H01L 2224/05548* (2013.01); *H01L 2224/05571* (2013.01); *H01L 2224/05572* (2013.01); *H01L 2224/10126* (2013.01); *H01L 2224/1191* (2013.01); *H01L 2224/13022* (2013.01);
(Continued)

(58) Field of Classification Search
CPC ........... H01L 23/3157; H01L 23/3192; H01L 24/05; H01L 23/488; H01L 24/13; H01L 24/11; H01L 21/76895
USPC .................. 257/737, E23.068, E21.09, 738; 438/478, 613
See application file for complete search history.

(56) References Cited

U.S. PATENT DOCUMENTS 5,072,520 A 12/1991 Nelson
5,869,904 A 2/1999 Shoji
(Continued)

FOREIGN PATENT DOCUMENTS

DE 102005040213 A1 3/2006
DE 112005001949 T5 5/2007
(Continued)

*Primary Examiner* — Trung Q Dang
(74) *Attorney, Agent, or Firm* — Slater Matsil, LLP

(57) ABSTRACT

A structure comprises a passivation layer formed over a semiconductor substrate, a connection pad enclosed by the passivation layer, a redistribution layer formed over the passivation layer, wherein the redistribution layer is connected to the connection pad, a bump formed over the redistribution layer, wherein the bump is connected to the redistribution layer and a molding compound layer formed over the redistribution layer. The molding compound layer comprises a flat portion, wherein a bottom portion of the bump is embedded in the flat portion of the molding compound layer and a protruding portion, wherein a middle portion of the bump is surrounded by the protruding portion of the molding compound layer.

21 Claims, 12 Drawing Sheets

(51) Int. Cl.
  *H01L 23/31* (2006.01)
  *H01L 21/56* (2006.01)
(52) U.S. Cl.
  CPC ........... *H01L2224/13024* (2013.01); *H01L 2224/13111* (2013.01); *H01L 2224/13561* (2013.01); *H01L 2224/13582* (2013.01); *H01L 2224/13611* (2013.01); *H01L 2224/16238* (2013.01); *H01L 2224/81191* (2013.01); *H01L 2224/81815* (2013.01); *H01L 2924/12042* (2013.01); *H01L 2924/181* (2013.01); *H01L 2924/351* (2013.01)

(56) References Cited

U.S. PATENT DOCUMENTS

| | | | |
|---|---|---|---|
| 6,037,065 A * | 3/2000 | Hajmrle et al. | 428/570 |
| 6,158,644 A * | 12/2000 | Brofman et al. | 228/56.3 |
| 6,187,615 B1 | 2/2001 | Kim et al. | |
| 6,369,451 B2 | 4/2002 | Lin | |
| 6,425,516 B1 | 7/2002 | Iwatsu et al. | |
| 6,586,322 B1 | 7/2003 | Chiu et al. | |
| 6,643,923 B1 | 11/2003 | Hishinuma et al. | |
| 6,664,637 B2 | 12/2003 | Jimarez et al. | |
| 6,933,613 B2 | 8/2005 | Akashi | |
| 6,940,169 B2 | 9/2005 | Jin et al. | |
| 7,187,068 B2 | 3/2007 | Suh et al. | |
| 7,372,151 B1 | 5/2008 | Fan et al. | |
| 7,749,882 B2 | 7/2010 | Kweon et al. | |
| 7,977,783 B1 * | 7/2011 | Park et al. | 257/692 |
| 8,264,089 B2 | 9/2012 | Alvarado et al. | |
| 8,362,612 B1 | 1/2013 | Paek et al. | |
| 8,624,392 B2 | 1/2014 | Yew et al. | |
| 8,735,273 B2 * | 5/2014 | Lu et al. | 438/597 |
| 2001/0050434 A1 | 12/2001 | Kaneda et al. | |
| 2002/0001937 A1 | 1/2002 | Kikuchi et al. | |
| 2003/0068847 A1 | 4/2003 | Watanabe et al. | |
| 2003/0096453 A1 | 5/2003 | Wang et al. | |
| 2004/0012930 A1 | 1/2004 | Grigg | |
| 2004/0027788 A1 | 2/2004 | Chiu et al. | |
| 2004/0072387 A1 | 4/2004 | Hong et al. | |
| 2004/0266162 A1 | 12/2004 | Feng | |
| 2005/0080956 A1 | 4/2005 | Zaudtke et al. | |
| 2006/0038291 A1 | 2/2006 | Chung et al. | |
| 2006/0063378 A1 | 3/2006 | Lin et al. | |
| 2007/0045840 A1 | 3/2007 | Varnau | |
| 2007/0102815 A1 | 5/2007 | Kaufmann et al. | |
| 2007/0108573 A1 * | 5/2007 | Chung et al. | 257/678 |
| 2007/0176290 A1 | 8/2007 | Park et al. | |
| 2007/0184577 A1 | 8/2007 | Chung et al. | |
| 2007/0187825 A1 | 8/2007 | Hashimoto | |
| 2007/0267745 A1 | 11/2007 | Chao et al. | |
| 2008/0001290 A1 | 1/2008 | Chou et al. | |
| 2008/0150134 A1 | 6/2008 | Shinkai et al. | |
| 2008/0308935 A1 | 12/2008 | Kim et al. | |
| 2009/0045513 A1 | 2/2009 | Kim et al. | |
| 2009/0052218 A1 | 2/2009 | Kang | |
| 2009/0130840 A1 | 5/2009 | Wang et al. | |
| 2009/0140442 A1 | 6/2009 | Lin | |
| 2009/0140942 A1 | 6/2009 | Mikkola et al. | |
| 2009/0146317 A1 | 6/2009 | Shih | |
| 2009/0206479 A1 | 8/2009 | Daubenspeck et al. | |
| 2009/0314519 A1 | 12/2009 | Soto et al. | |
| 2010/0065966 A1 | 3/2010 | Pendse et al. | |
| 2010/0078772 A1 | 4/2010 | Robinson | |
| 2010/0096754 A1 | 4/2010 | Lee et al. | |
| 2010/0140760 A1 | 6/2010 | Tam et al. | |
| 2011/0037158 A1 | 2/2011 | Youn et al. | |
| 2011/0101520 A1 | 5/2011 | Liu et al. | |
| 2011/0108983 A1 | 5/2011 | Lu et al. | |
| 2011/0278739 A1 | 11/2011 | Lai et al. | |
| 2012/0006592 A1 | 1/2012 | Ouchi et al. | |
| 2012/0199959 A1 | 8/2012 | Hart et al. | |
| 2012/0199991 A1 | 8/2012 | Okamoto et al. | |
| 2012/0261817 A1 | 10/2012 | Do et al. | |
| 2013/0009307 A1 * | 1/2013 | Lu et al. | 257/738 |
| 2013/0105971 A1 | 5/2013 | Daubenspeck et al. | |
| 2013/0147031 A1 | 6/2013 | Chen et al. | |
| 2013/0168850 A1 | 7/2013 | Samoilov et al. | |
| 2013/0181338 A1 * | 7/2013 | Lu et al. | 257/737 |
| 2014/0054764 A1 * | 2/2014 | Lu et al. | 257/737 |
| 2014/0077361 A1 * | 3/2014 | Lin et al. | 257/737 |
| 2014/0187103 A1 | 7/2014 | Chen et al. | |
| 2014/0231125 A1 | 8/2014 | Chen et al. | |
| 2014/0232017 A1 * | 8/2014 | Rampley et al. | 257/782 |
| 2015/0123269 A1 | 5/2015 | Chen et al. | |
| 2015/0137352 A1 | 5/2015 | Chen et al. | |
| 2015/0235977 A1 | 8/2015 | Shao et al. | |
| 2015/0243613 A1 | 8/2015 | Chen et al. | |
| 2015/0262948 A1 | 9/2015 | Lu et al. | |

FOREIGN PATENT DOCUMENTS

| | | |
|---|---|---|
| KR | 1020070076846 | 7/2007 |
| KR | 20090018442 A | 2/2009 |
| KR | 20090120215 A | 11/2009 |
| KR | 20100131180 A | 12/2010 |

* cited by examiner

INTERCONNECT STRUCTURE AND METHOD OF FABRICATING SAME

REFERENCE TO RELATED APPLICATIONS

This application relates to the following co-pending and commonly assigned patent applications: Ser. No. 13/349,405, filed Jan. 12, 2012, entitled "Package on Package Interconnect Structure;" Ser. No. 13/751,289, filed Jan. 28, 2013, entitled "System and Method for an Improved Fine Pitch Joint;" Ser. No. 13/838,748, filed Mar. 15, 2013, entitled "Interconnect Structures and Methods of Forming Same;" Ser. No. 13/868,554, filed Apr. 23, 2013, entitled "Apparatus and Method for Wafer Separation;" Ser. No. 13/913,599, filed Jun. 10, 2013, entitled "Interconnect Joint Protective Layer Apparatus and Method;" Ser. No. 13/914,426, filed Jun. 10, 2013, entitled "Interconnect Structures and Methods of Forming Same;" Ser. No. 13/934,562, filed Jul. 3, 2013, entitled "Packaging Devices, Methods of Manufacture Thereof, and Packaging Methods" and Ser. No. 13/939,966, filed Jul. 11, 2013, entitled "Apparatus and Method for Package Reinforcement."

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, wafer-level chip scale package structures have emerged as an effective alternative to further reduce the physical size of semiconductor devices. In a wafer-level chip scale package structure, active devices such as transistors and the like are formed at the top surface of a substrate of the wafer-level chip scale package structure. A variety of metallization layers comprising interconnect structures are formed over the substrate. A metal pad is formed over the top metallization layer and electrically coupled to the interconnect structures. A passivation layer and a first polymer layer may be formed over the metal pad. The metal pad is exposed through the openings in the passivation layer and the first polymer layer.

A first seed layer is then formed on the first polymer layer. Post-passivation interconnect (PPI) metal lines and pads may be formed over the first seed layer by using suitable fabrication techniques such as forming and patterning a first photo resist layer on the first seed layer, plating the PPI metal lines and pads in the openings in the first photo resist layer, and then removing the first photo resist layer. Furthermore, the portions of the first seed layer that were previously covered by the first photo resist layer are removed by using suitable etching processes.

A second polymer layer may be formed over the PPI lines and pads. A second opening for an under bump metallization (UBM) structure is formed by using suitable fabrication techniques such as patterning. A second seed layer is formed over the second polymer layer. The UBM structure is formed extending into the second opening in the second polymer layer, wherein the UBM structure is electrically connected to the PPI metal lines and pads. The fabrication steps of the UBM structure include forming a second photo resist layer over the second seed layer, patterning the second photo resist layer, forming the UBM structure on the second seed layer, removing the second photo resist layer, and removing the portions of the second seed layer that were previously covered by the second photo resist layer.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a structure and fabrication steps of a semiconductor device having a chip scale packaging feature. The embodiments of the disclosure may also be applied, however, to a variety of semiconductor devices. Hereinafter, various embodiments will be explained in detail with reference to the accompanying drawings.

Figure 1:
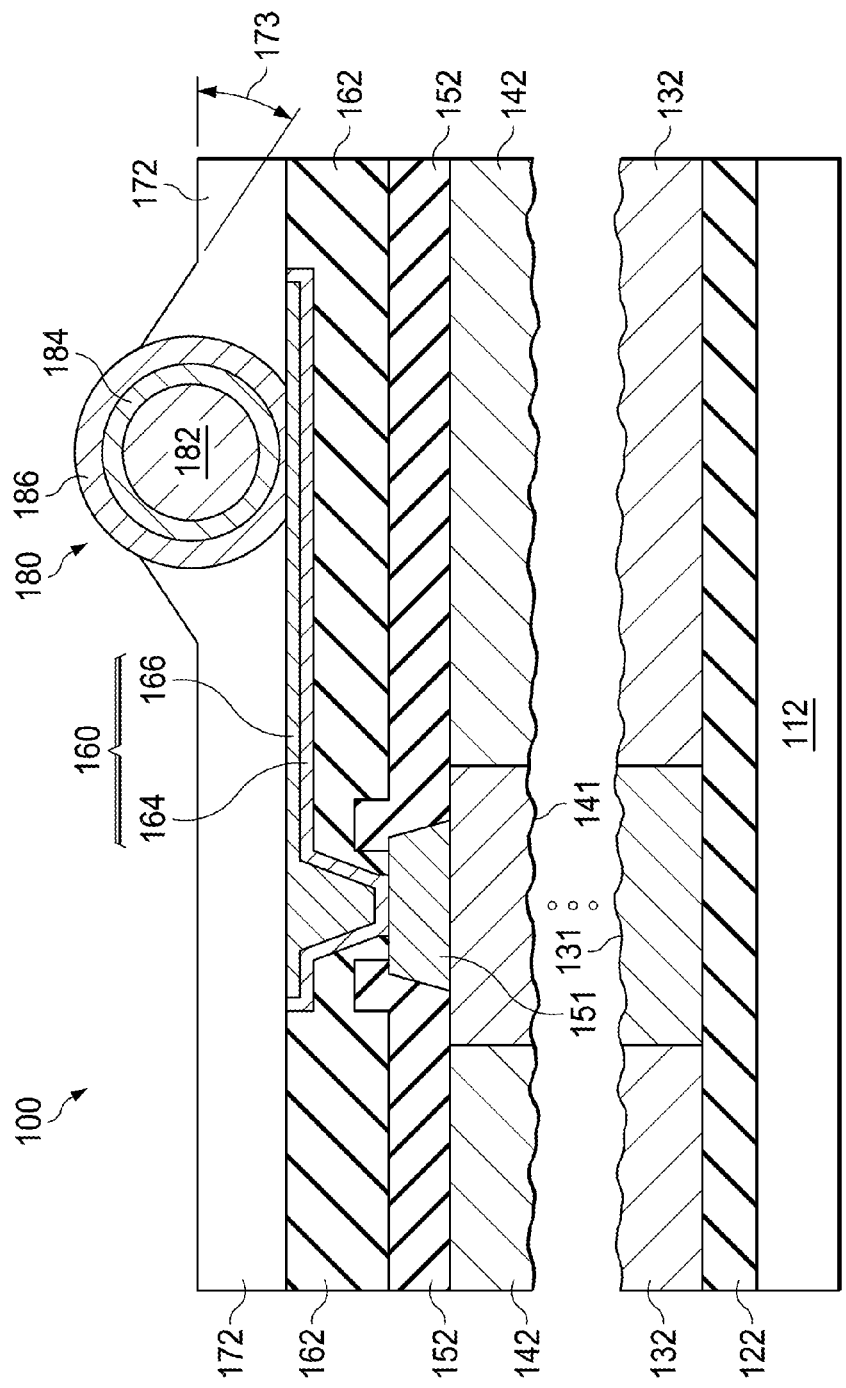
FIG. 1 illustrates a cross sectional view of a semiconductor device having a chip scale packaging feature in accordance with various embodiments of the present disclosure.

FIG. 1 illustrates a cross sectional view of a semiconductor device having a chip scale packaging feature in accordance with various embodiments of the present disclosure. As shown in FIG. 1, the semiconductor device 100 comprises a substrate 112. The substrate 112 may be formed of silicon, silicon germanium, silicon carbide or the like. Alternatively, the substrate 112 may be a silicon-on-insulator (SOI) substrate. The SOI substrate may comprise a layer of a semiconductor material (e.g., silicon, germanium and the like) formed over an insulator layer (e.g., buried oxide and the like), which is formed in a silicon substrate. In addition, other substrates that may be used include multi-layered substrates, gradient substrates, hybrid orientation substrates and the like.

The substrate 112 may further comprise a variety of electrical circuits (not shown). The electrical circuits formed on the substrate 112 may be any type of circuitry suitable for a particular application. In accordance with some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like.

One of ordinary skill in the art will appreciate that the above examples are provided for illustrative purposes only to further explain applications of the present disclosure and are not meant to limit the present disclosure in any manner.

An interlayer dielectric layer 122 is formed on top of the substrate 112. The interlayer dielectric layer 122 may be formed, for example, of a low-K dielectric material, such as silicon oxide. The interlayer dielectric layer 122 may be formed by any suitable method known in the art, such as spinning, chemical vapor deposition (CVD) and plasma enhanced chemical vapor deposition (PECVD). It should also be noted that one skilled in the art will recognize that the interlayer dielectric layer 122 may further comprise a plurality of dielectric layers.

A bottom metallization layer 132 and a top metallization layer 142 are formed over the interlayer dielectric layer 122. As shown in FIG. 1, the bottom metallization layer 132 comprises a first metal line 131. Likewise, the top metallization layer 142 comprises a second metal line 141. Metal lines 131 and 141 are formed of metal materials such as copper or copper alloys and the like. The metallization layers 132 and 142 may be formed through any suitable techniques (e.g., deposition, damascene and the like). Generally, the one or more inter-metal dielectric layers and the associated metallization layers are used to interconnect the electrical circuits in the substrate 112 to each other to form functional circuitry and to further provide an external electrical connection.

It should be noted while FIG. 1 shows the bottom metallization layer 132 and the top metallization layer 142, one skilled in the art will recognize that one or more inter-metal dielectric layers (not shown) and the associated metallization layers (not shown) are formed between the bottom metallization layer 132 and the top metallization layer 142. In particular, the layers between the bottom metallization layer 132 and the top metallization layer 142 may be formed by alternating layers of dielectric (e.g., extremely low-k dielectric material) and conductive materials (e.g., copper).

A passivation layer 152 is formed on top of the top metallization layer 142. In accordance with an embodiment, the passivation layer 152 is formed of non-organic materials such as un-doped silicate glass, silicon nitride, silicon oxide and the like. Alternatively, the passivation layer 152 may be formed of low-k dielectric such as carbon doped oxide and the like. In addition, extremely low-k (ELK) dielectrics such as porous carbon doped silicon dioxide can be employed to form the passivation layer 152.

The passivation layer 152 may be formed through any suitable techniques such as CVD. As shown in FIG. 1, there may be an opening formed in the passivation layer 152. The opening is used to accommodate a top metal pad 151.

As shown in FIG. 1, the top metal pad 151 is embedded in the passivation layer 152. In particular, the top metal pad 151 provides a conductive channel between the metal line 141 and a post passivation interconnect structure 160 of the semiconductor device 100. The top metal pad 151 may be made of metallic materials such as copper, copper alloys, aluminum, silver, gold and any combinations thereof, and/or multi-layers thereof. The top metal pad 151 may be formed by suitable techniques such as CVD. Alternatively, the top metal pad 151 may be formed by sputtering, electroplating and the like.

A first dielectric layer 162 is formed on top of the passivation layer 152. The first dielectric layer 162 is made of polymer materials such as epoxy, polyimide and the like. Alternatively, the first dielectric layer 162 may be formed of suitable polymer dielectric materials such as polybenzoxazole (PBO) and the like. Throughout the description, the first dielectric layer 162 may be alternatively referred to as the first polymer layer 162. The first polymer layer 162 may be made by any suitable method known in the art such as spin coating and/or the like.

A post passivation interconnect structure 160 is formed in the first polymer layer 162. As shown in FIG. 1, the post passivation interconnect structure 160 may comprise a seed layer 164 and a metal line 166 formed over the seed layer 164. The post passivation interconnect structure 160 connects the metal pad 151 with an input/output terminal of the semiconductor device 100 (e.g., bump 180). More particularly, the post passivation interconnect structure 160 provides a conductive path between the metal lines (e.g., metal line 141) and the input/output terminal of the semiconductor device 100 (e.g., bump 180). The operation principles of post passivation interconnect structures are well known in the art, and hence are not discussed in detail herein. Throughout the description, the post passivation interconnect structure 160 may be alternatively referred to as a redistribution layer 160.

The bump 180 is mounted on the metal line 166. In accordance with some embodiments, the bump 180 may be a solder ball 182 including a metal coating layer 184 as shown in FIG. 1. In accordance with some embodiments, the metal coating layer 184 is formed of copper. Throughout the description, the metal coating layer 184 is alternatively referred to as a copper coating layer 184.

In accordance with another embodiment, the bump 180 may include a solder ball 182, the copper coating layer 184 and a solder layer 186. The solder ball 182 and the solder layer 186 may be made of any of suitable materials. In accordance with an embodiment, the solder ball 182 and the solder layer 186 may be formed of SAC405. SAC405 comprises 95.5% Sn, 4.0% Ag and 0.5% Cu.

In accordance with an embodiment, the copper coating layer 184 may be formed by suitable semiconductor packaging technologies such as sputtering, electroplating, any combination thereof and/or the like. The thickness of the copper coating layer 184 is in a range from about 2 um to about 20 um.

The semiconductor device 100 may further comprise a liquid molding compound layer 172. As shown in FIG. 1, the liquid molding compound layer 172 is formed over the first polymer layer 162 and the metal line 166. In particular, the bump 180 is partially embedded in the liquid molding compound layer 172. As shown in FIG. 1, the top surface of the liquid molding compound layer 172 is approximately planar except that there may be a slope adjacent to the bump 180. The slope and the top surface of the liquid molding compound layer 172 may form an angle 173. In some embodiments, the angle 173 is in a range from about 10 degrees to about 60 degrees. Throughout the description, the slope portions of the liquid molding compound layer 172 may be alternatively referred to as protruding portions of the liquid molding compound layer 172.

In accordance with an embodiment, the liquid molding compound layer 172 may be formed of suitable materials such as epoxy, which is dispensed on the top surface of the semiconductor device 100. The epoxy may be applied in a liquid form, and may harden after a curing process. The thickness of the flat portion of the liquid molding compound layer 172 is in a range from about 50 um to about 350 um.

An advantageous feature of having the liquid molding compound layer 172 is that the liquid molding compound layer 172 may function as a protection layer so as to protect the bump 180 as well as the other portions of the semiconductor device 100 from heat, shock, humidity and corrosion.

In addition, the liquid molding compound layer 172 helps to prevent the bump 180 from cracking during reliability tests such as thermal cycling processes. Furthermore, the liquid molding compound layer 172 may help to reduce the mechanical and thermal stresses during the fabrication process of the semiconductor device 100.

Figure 2:
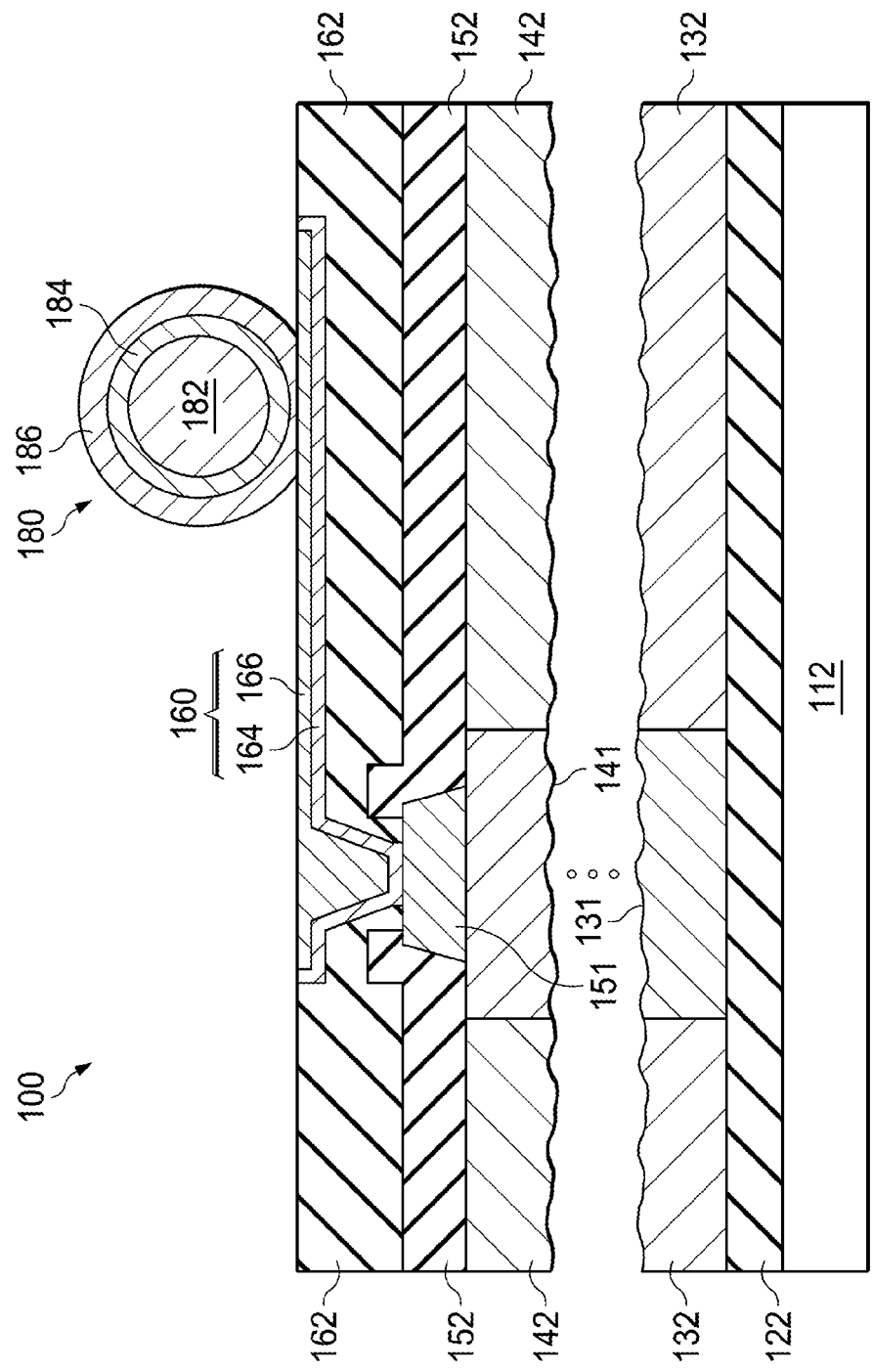
FIG. 2 illustrates a bump mounted on a metal line of a semiconductor device in accordance with various embodiments of the present disclosure.

FIGS. 2-7 are cross sectional views of intermediate stages in the making of the semiconductor device 100 shown in FIG. 1 in accordance with an embodiment. FIG. 2 illustrates a bump mounted on a metal line of a semiconductor device in accordance with various embodiments of the present disclosure. The bump 180 is mounted on the top surface of the metal line 166. In some embodiments, a reflow process may be employed to melt the bottom portion of the solder layer 186 so that the bump 180 is bonded on the metal line 166. Other elements shown in FIG. 2 have been described in detail with respect to FIG. 1, and hence are not discussed herein to avoid unnecessary repetition.

One advantageous feature of mounting the bump 180 on the metal line 166 is that the direct bonding of the bump 180 on the metal line 166 helps to reduce the fabrication cost of a wafer level chip scale package. For example, in a conventional fabrication process, in order to mount a bump on an under bump metallization structure, there may be four mask layers formed during the fabrication process. By employing this direct bonding technique described above with respect to FIG. 2, the mask layers for forming the under bump metallization structure may be saved. As a result, the fabrication cost as well as the reliability of the wafer level chip scale package is improved.

Figure 3:
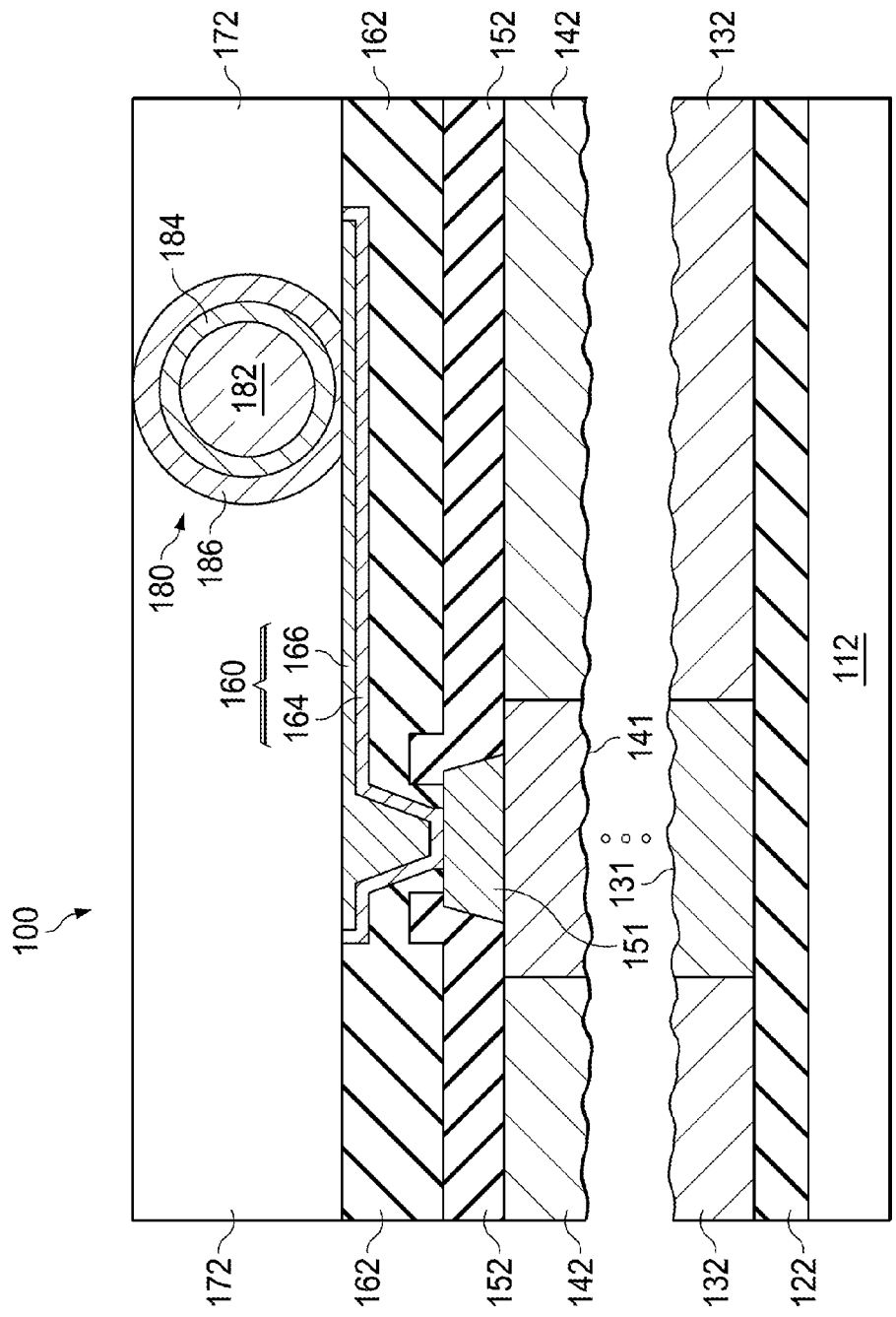
FIG. 3 illustrate a cross sectional view of the semiconductor device shown in FIG. 2 after an intermediate liquid molding compound layer is formed over the semiconductor device in accordance with various embodiments of the present disclosure.

FIG. 3 illustrate a cross sectional view of the semiconductor device shown in FIG. 2 after an intermediate liquid molding compound layer is formed over the semiconductor device in accordance with various embodiments of the present disclosure. As shown in FIG. 3, a liquid molding compound material is applied on the semiconductor device 100 to from a liquid molding compound layer 172. In accordance with an embodiment, the liquid molding compound layer 172 may be formed of epoxy. As shown in FIG. 3, the bump 180 is embedded in the liquid molding compound layer 172.

Figure 4:
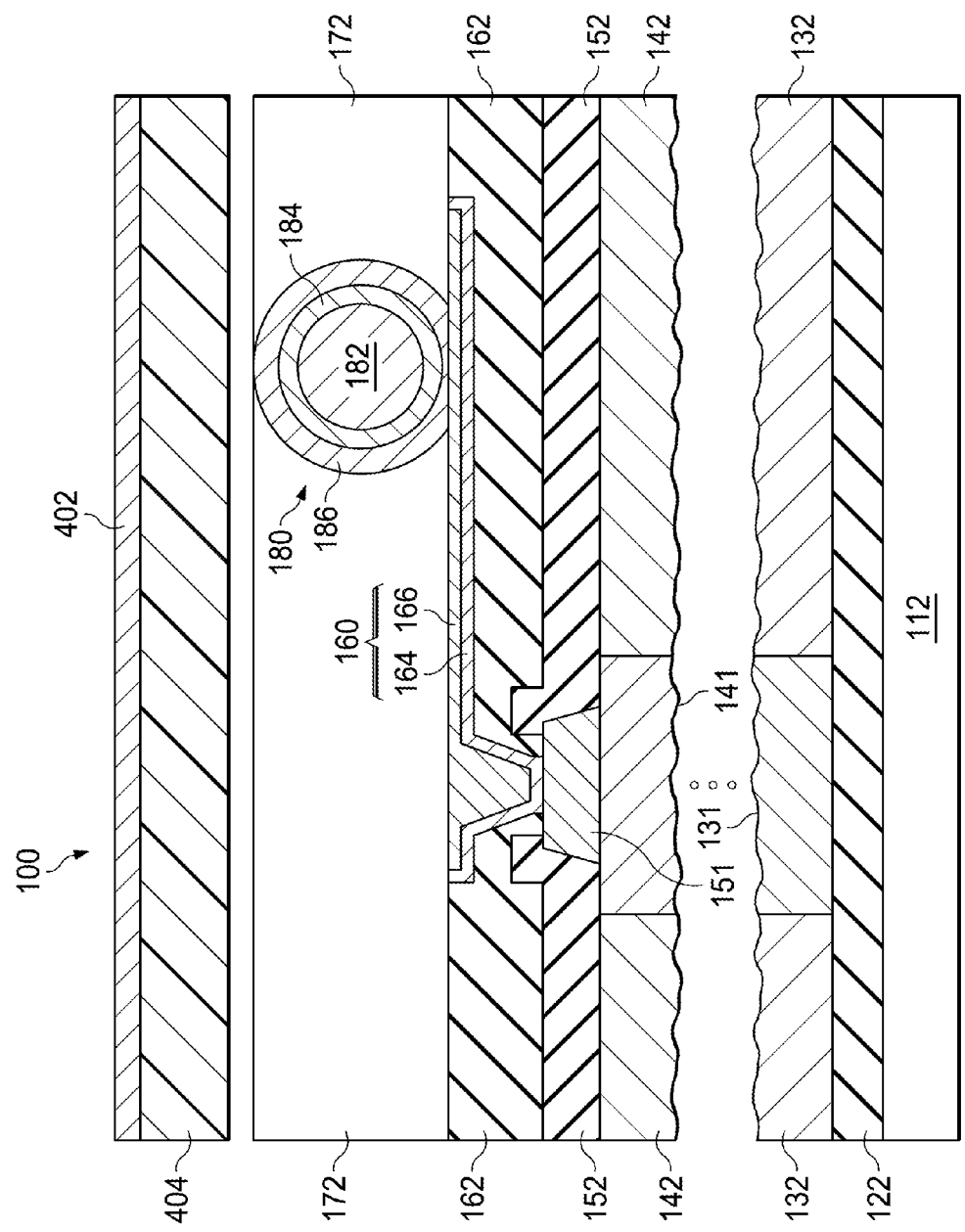
FIG. 4 illustrates a release film used for pressing the liquid molding compound layer in accordance with various embodiments of the present disclosure.

FIG. 4 illustrates a release film used for pressing the liquid molding compound layer in accordance with various embodiments of the present disclosure. The release film 404 is formed of soft materials such as Ethylene Tetrafluoroethylene (ETFE). As shown in FIG. 4, the soft material layer is attached to a metal plate 402.

Figure 5:
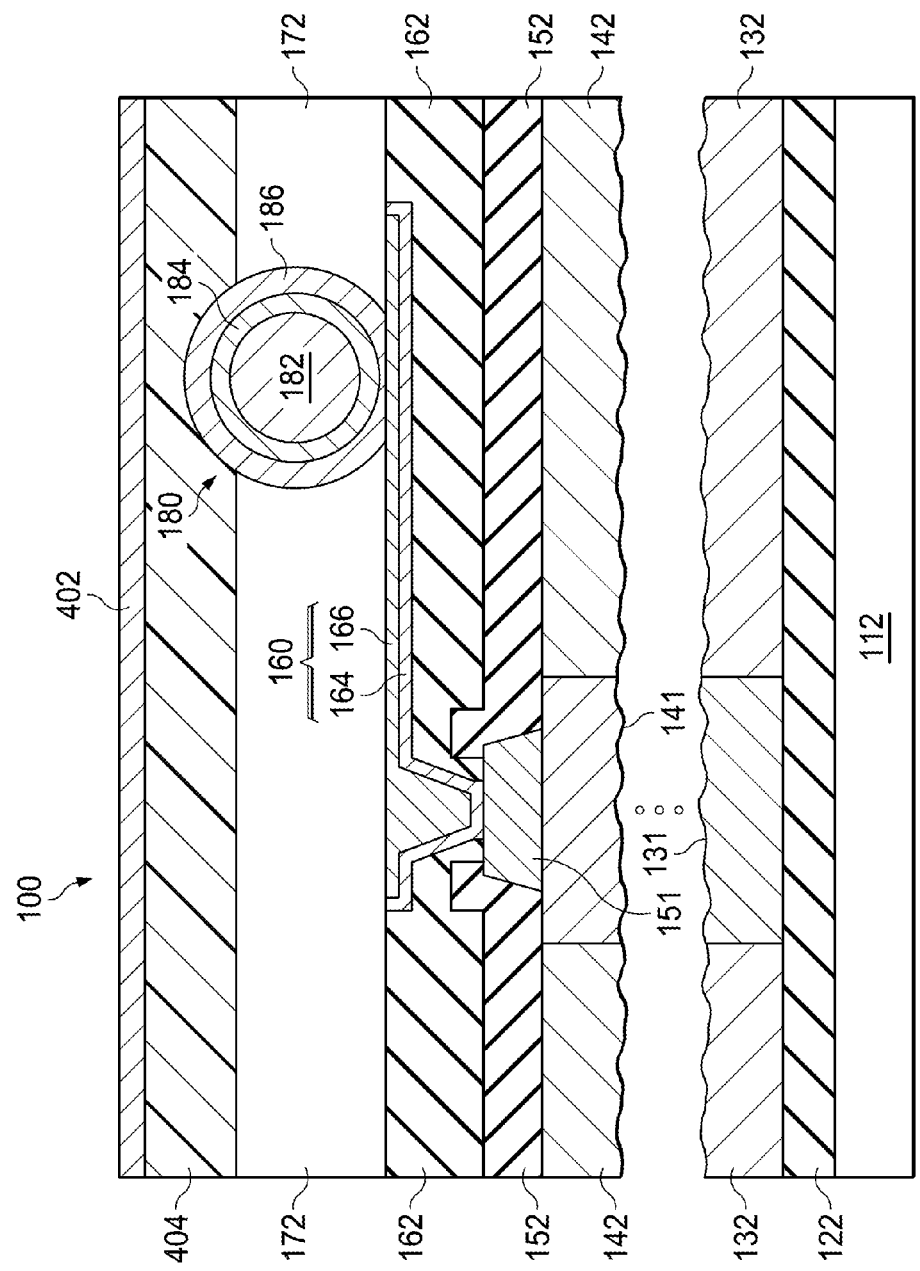
FIG. 5 illustrates a method of pressing the intermediate liquid molding compound layer to form the final liquid molding compound layer in accordance with various embodiments of the present disclosure.

FIG. 5 illustrates a method of pressing the intermediate liquid molding compound layer to form the final liquid molding compound layer in accordance with various embodiments of the present disclosure. As the pressure from the metal plate 402 is applied, a portion of the bump 180 is pressed into the release film layer 404. In addition, the release film layer 404 may push a portion of the liquid molding compound layer 172 away from the top surface of the semiconductor device 100. As a result, the bottom surface of the release film layer 404 may be lower than the top end of the bump 180.

Furthermore, a curing process may be applied to the liquid molding compound layer 172. Such a curing process may solidify the liquid molding compound to generate a molding compound layer in a solid form.

Figure 6:
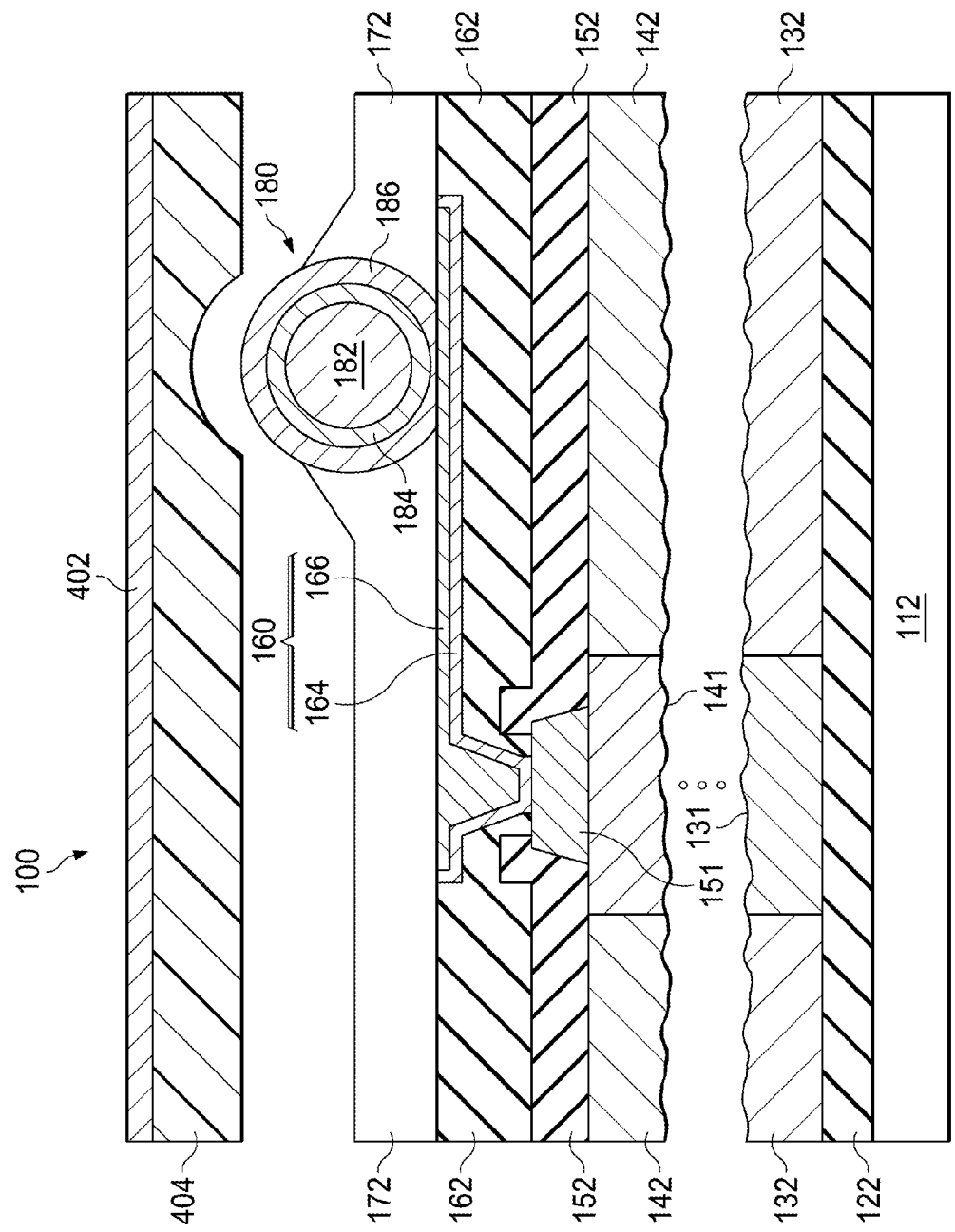
FIG. 6 illustrates a cross sectional view of the semiconductor device shown in FIG. 5 after removing the release film in accordance with various embodiments of the present disclosure.

FIG. 6 illustrates a cross sectional view of the semiconductor device shown in FIG. 5 after removing the release film in accordance with various embodiments of the present disclosure. After the release film 404 is removed from the semiconductor device 100, there may be a thin layer of molding compound residue (not shown) left on the top surface of the bump 180. The rest portion of the liquid molding compound layer 172 is lower than the top end of the bump 180.

Figure 7:
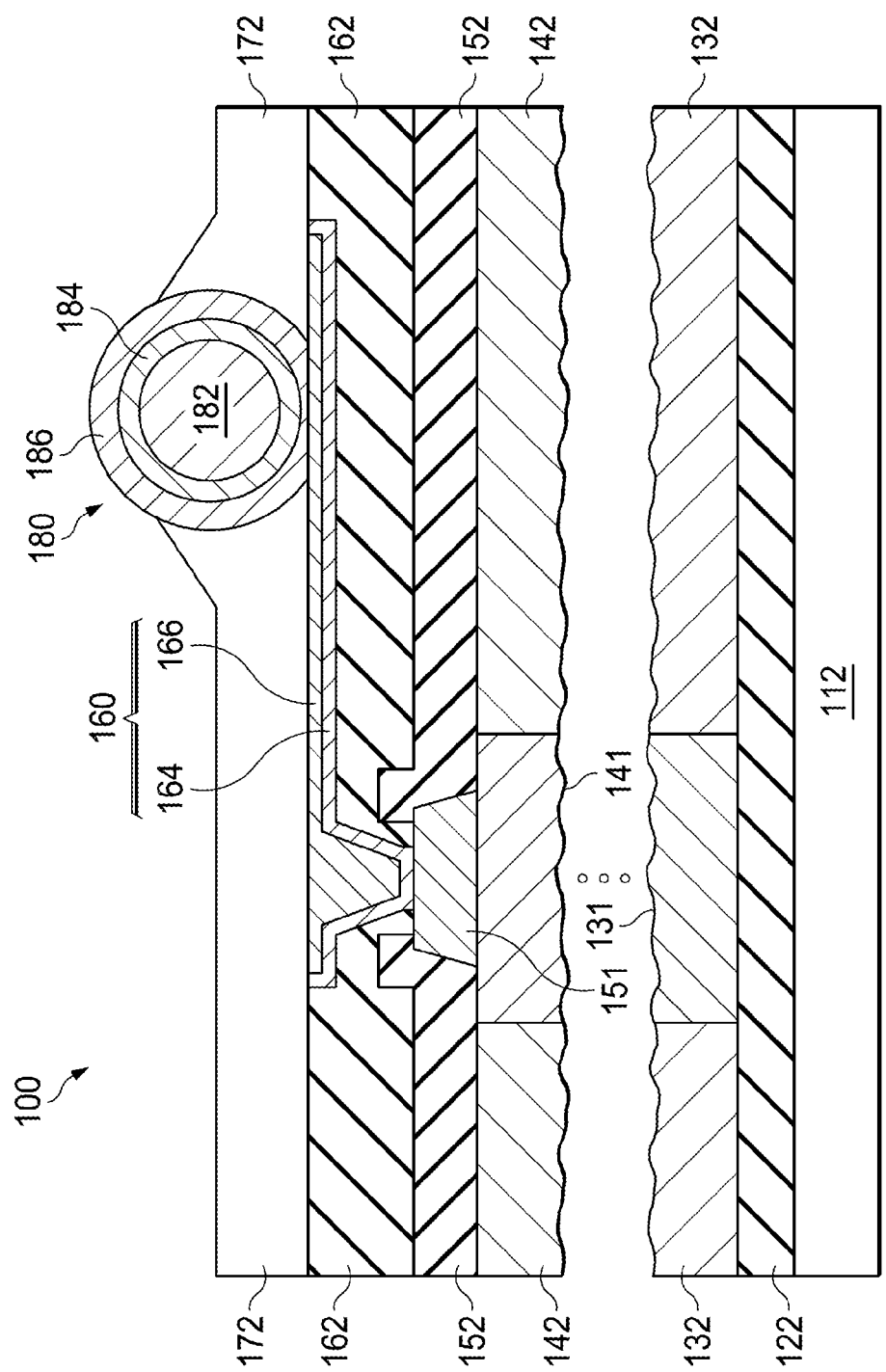
FIG. 7 illustrates a cross section view of the semiconductor device shown in FIG. 6 after removing the thin molding compound layer in accordance with various embodiments of the present disclosure.

FIG. 7 illustrates a cross section view of the semiconductor device shown in FIG. 6 after removing the thin molding compound layer in accordance with various embodiments of the present disclosure. The thin molding compound layer on the top surface of the bump 180 may be removed by suitable etching techniques such as wet or plasma etching processes.

Figure 8:
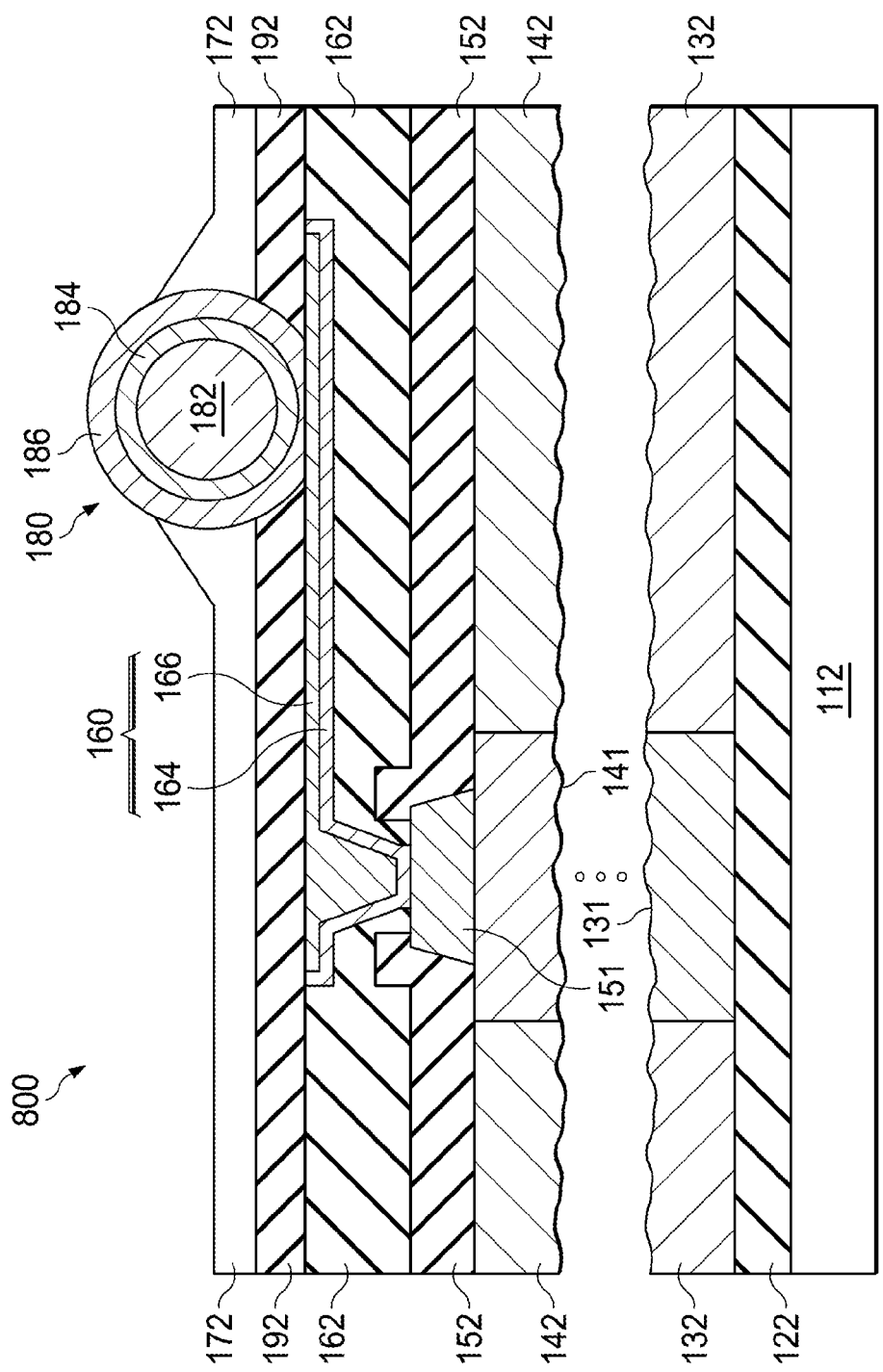
FIG. 8 illustrates a cross sectional view of another semiconductor device having a chip scale packaging feature in accordance with various embodiments of the present disclosure.

FIG. 8 illustrates a cross sectional view of another semiconductor device having a chip scale packaging feature in accordance with various embodiments of the present disclosure. The semiconductor device 800 shown in FIG. 8 is similar to the semiconductor device 100 shown in FIG. 1 except that there may be a second polymer layer 192 located between the first polymer layer 162 and the liquid molding compound layer 172.

As shown in FIG. 8, the second polymer layer 192 is formed on top of the first polymer layer 162. The second polymer layer 192 is made of polymer materials such as epoxy, polyimide and the like. Alternatively, the second polymer layer 192 may be formed of suitable polymer dielectric materials such as PBO. The second polymer layer 192 may be of a thickness in a range from about 4 um to about 10 um. The second polymer layer 192 may be made by any suitable method known in the art such as spin coating and/or the like.

It should be noted that the bump 180 is mounted on the metal line 166 directly. The bottom portion of the bump 180 is surrounded by the second polymer layer 192. As shown in FIG. 8, the solder of the solder layer 186 may fill the gap between the second polymer layer 192 and the metal coating layer 184.

Figure 9:
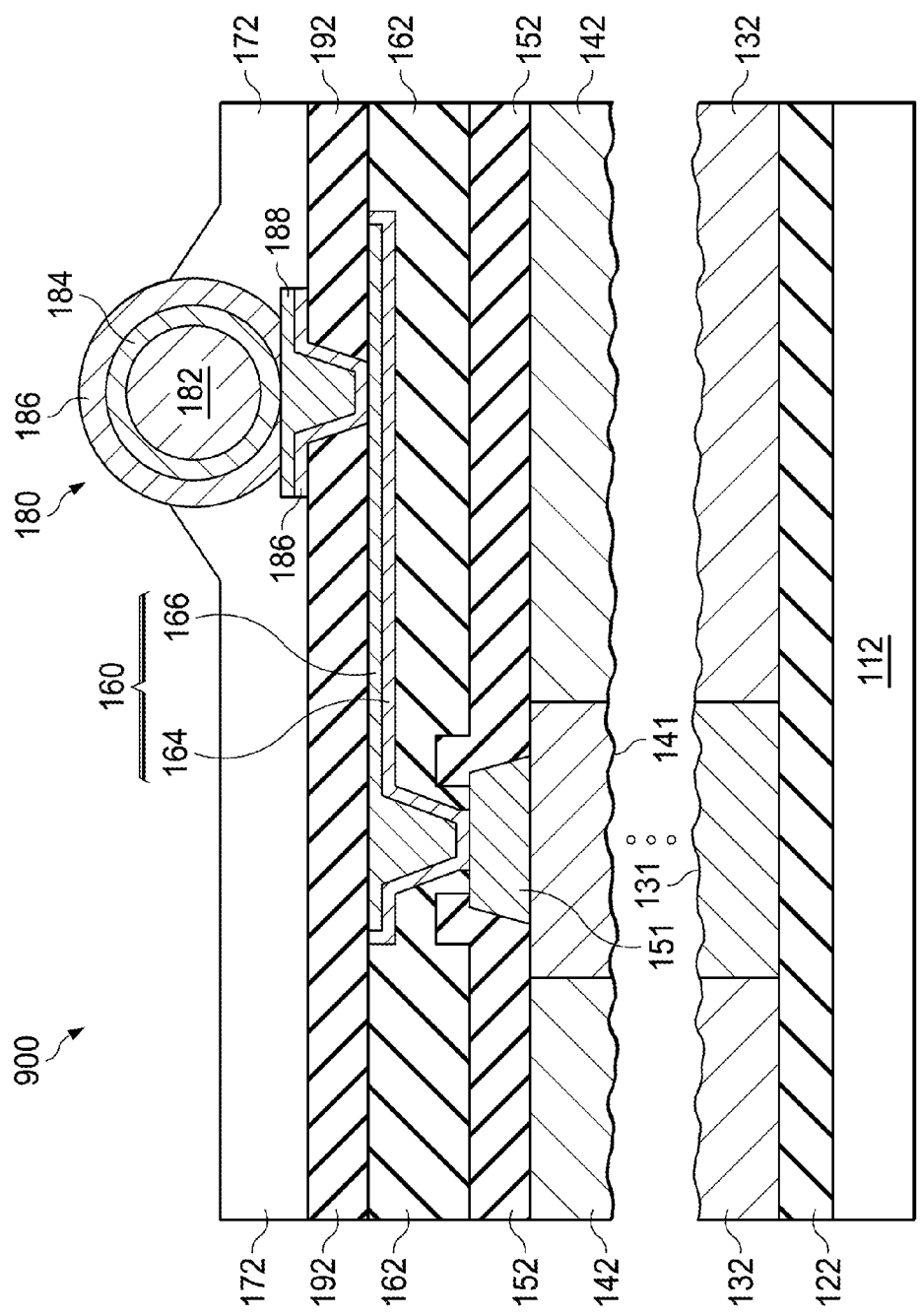
FIG. 9 illustrates a cross sectional view of another semiconductor device having a chip scale packaging feature in accordance with various embodiments of the present disclosure.

FIG. 9 illustrates a cross sectional view of another semiconductor device having a chip scale packaging feature in accordance with various embodiments of the present disclosure. The semiconductor device 900 shown in FIG. 9 is similar to the semiconductor device 800 shown in FIG. 8 except that the bump 180 is formed over an under bump metallization (UBM) structure. In some embodiments, the second polymer layer 192 is patterned to form an opening. The patterning process may be implemented by using suitable semiconductor fabrication technologies such as a laser ablation process and/or the like.

As shown in FIG. 9, the UBM structure may comprise a UBM seed layer 186 and a conductive material layer 188. The UBM seed layer 186 is deposited on the opening of the second polymer layer 192. The UBM seed layer 186 may comprise conductive materials such as copper. The UBM seed layer 186 may be implemented by using suitable fabrication techniques such as sputtering, CVD or the like.

As shown in FIG. 9, in order to obtain a reliable UBM structure, additional conductive materials may be deposited in a conformal manner on top of the UBM seed layer 186 to form an additional conductive layer 188. The conductive material may be copper, but can be any suitable conductive materials, such as copper alloys, aluminum, tungsten, silver and combinations thereof. The conductive layer 188 may be formed by suitable techniques such as an electro-less plating process.

Figure 10:
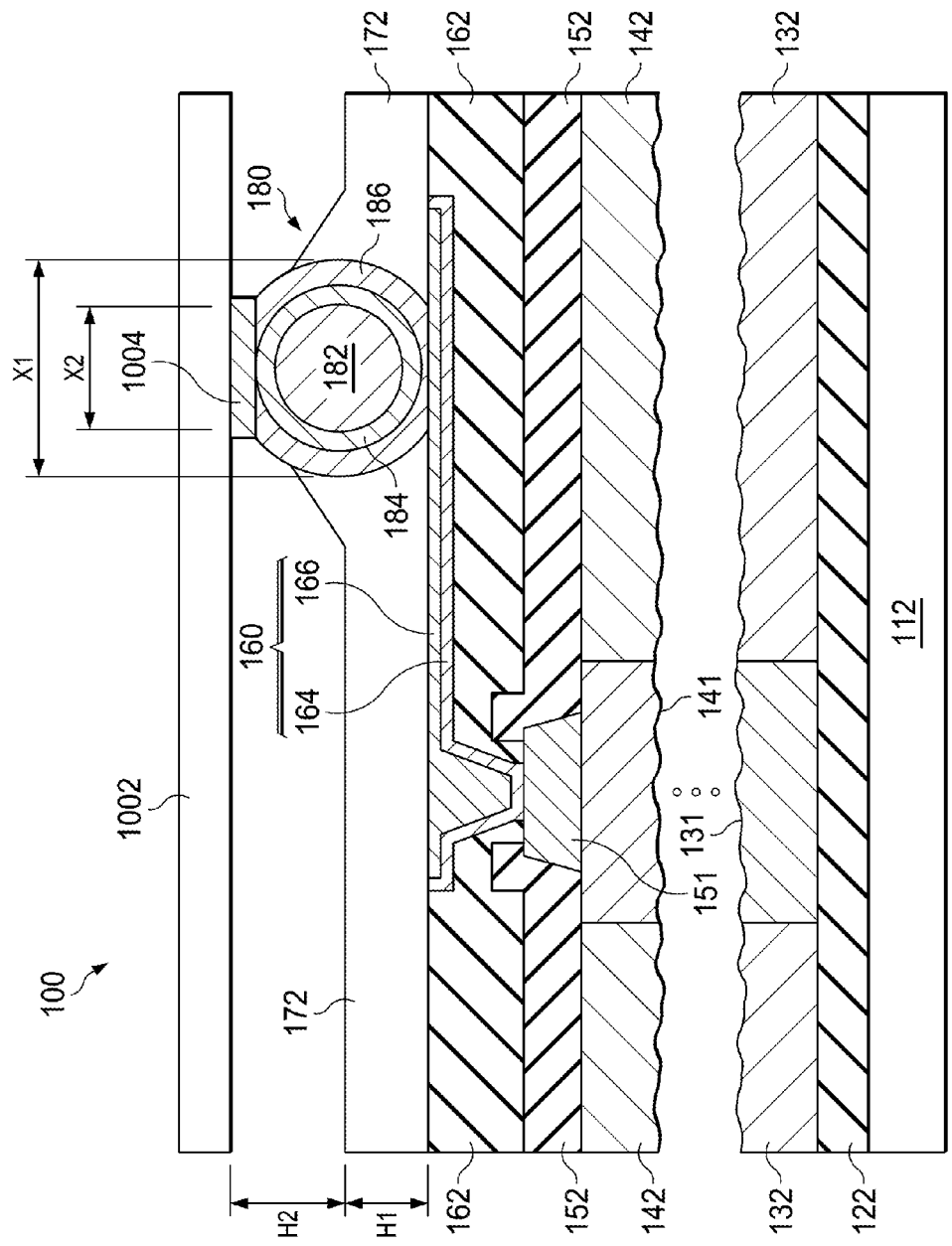
FIG. 10 illustrates a cross sectional view of the semiconductor device shown in FIG. 1 after the semiconductor device is mounted on a packaging substrate in accordance with various embodiments of the present disclosure.

FIG. 10 illustrates a cross sectional view of the semiconductor device shown in FIG. 1 after the semiconductor device is mounted on a packaging substrate in accordance with various embodiments of the present disclosure. The packaging substrate 1002 may comprise a connection pad 1004. More particularly, as shown in FIG. 10, the connection pad 1004 is protruding over the top surface of the packaging substrate 1002.

The semiconductor device 100 may be mounted on the packaging substrate 1002 through a reflow process. After the reflow process, the bump 180 and the connection pad 1004 form a joint structure as shown in FIG. 10. As shown in FIG. 10, the diameter of the bump 180 is defined as X1. The length of the connection pad 1004 is defined as X2. In some embodiments, the ratio of X1 to X2 is in a range from about 1 to about 1.2.

The thickness of the flat portion of the liquid molding compound layer 172 is defined as H1. There may be a gap between the top surface of the liquid molding compound layer 172 and the packaging substrate 1002. The gap is of a dimension H2. In accordance with some embodiments, H1 is in a range from about 50 um to about 350 um. H2 is in a range from about 20 um to about 150 um.

One advantageous feature of having the copper coating layer 184 is that the copper coating layer 184 helps to retain the bump's shape during the reflow process. As such, the packaging substrate 1002 is kept higher from the semiconductor device 100. Such an increased gap helps to increase the solder joint flexibility so as to improve the reliability of the fine-pitch semiconductor device 100.

Figure 11:
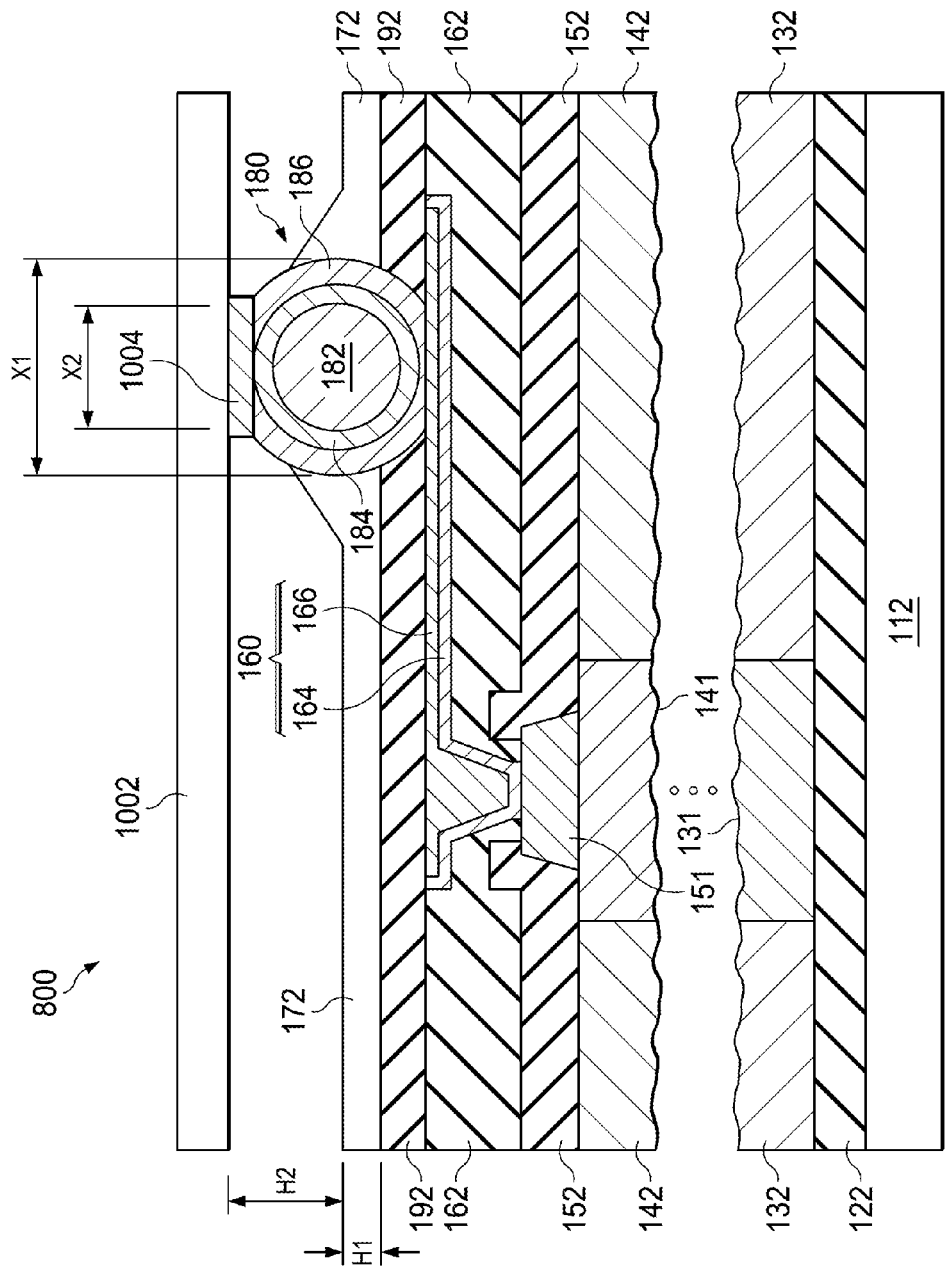
FIG. 11 illustrates a cross sectional view of the semiconductor device shown in FIG. 8 after the semiconductor device is mounted on a packaging substrate in accordance with various embodiments of the present disclosure.

FIG. 11 illustrates a cross sectional view of the semiconductor device shown in FIG. 8 after the semiconductor device is mounted on a packaging substrate in accordance with various embodiments of the present disclosure. The dimensions shown in FIG. 11 are similar to the dimensions shown in FIG. 10, and hence are not discussed herein to avoid unnecessary repetition.

Figure 12:
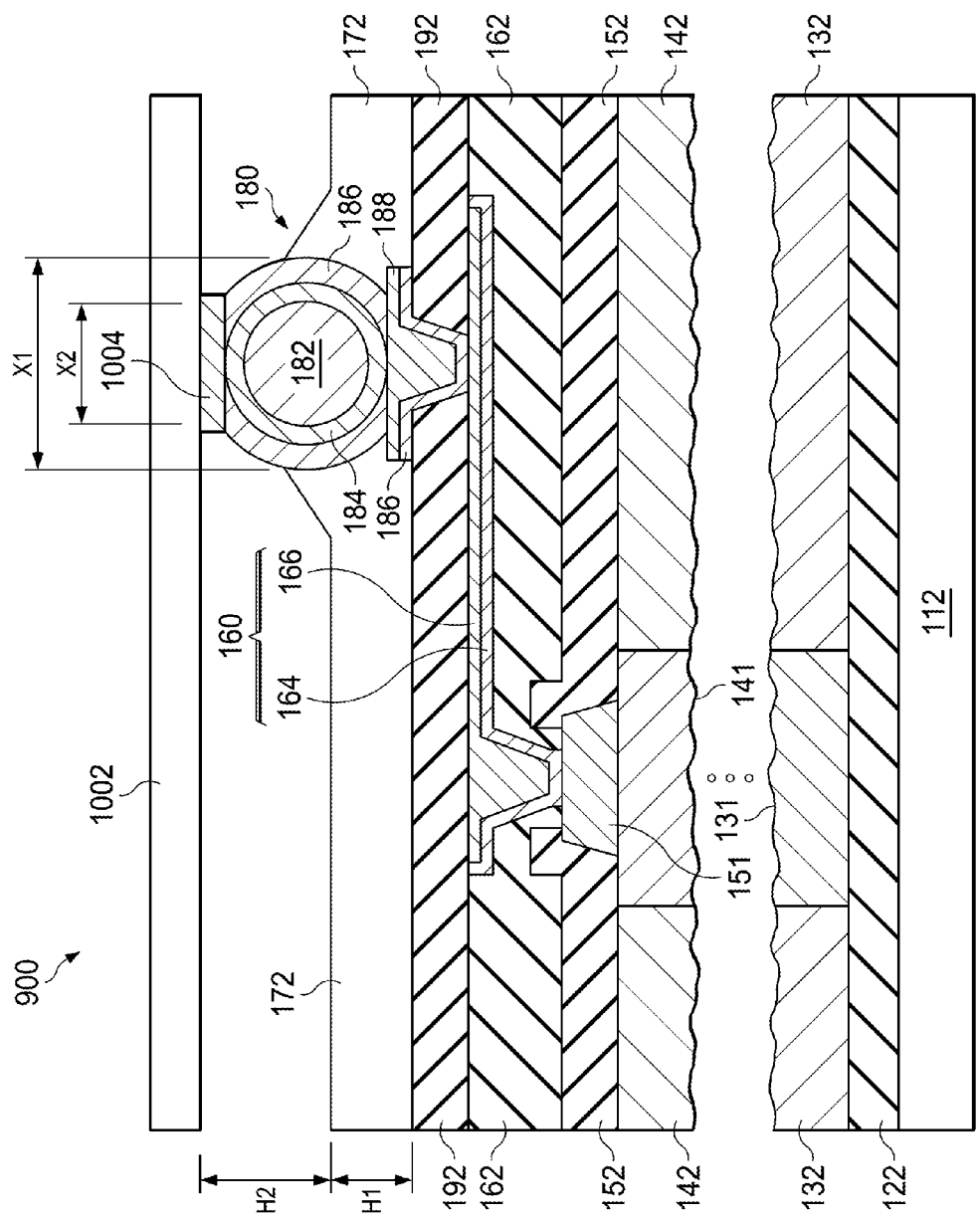
FIG. 12 illustrates a cross sectional view of the semiconductor device shown in FIG. 9 after the semiconductor device is mounted on a packaging substrate in accordance with various embodiments of the present disclosure.

FIG. 12 illustrates a cross sectional view of the semiconductor device shown in FIG. 9 after the semiconductor device is mounted on a packaging substrate in accordance with various embodiments of the present disclosure. The dimensions shown in FIG. 12 are similar to the dimensions shown in FIG. 10, and hence are not discussed herein to avoid unnecessary repetition.

In accordance with an embodiment, a structure comprises a passivation layer formed over a semiconductor substrate, a connection pad enclosed by the passivation layer, a redistribution layer formed over the passivation layer, wherein the redistribution layer is connected to the connection pad, a bump formed over the redistribution layer, wherein the bump is connected to the redistribution layer and comprises a metal coating layer.

The structure further comprises a molding compound layer formed over the redistribution layer, wherein the molding compound layer comprises a flat portion, and wherein a bottom portion of the bump is embedded in the flat portion of the molding compound layer and a protruding portion, and wherein a middle portion of the bump is surrounded by the protruding portion of the molding compound layer, and wherein the protruding portion of the molding compound layer and the flat portion of the molding compound layer form an angle in a range from about 10 degrees to about 60 degrees.

In accordance with an embodiment, a device comprises an interconnect structure over a substrate, a passivation layer over the interconnect structure, wherein a metal pad is embedded in the passivation layer and exposed through an opening of the passivation layer, a first dielectric layer formed over the passivation layer, a post passivation interconnect structure formed in the first dielectric layer, wherein the post passivation interconnect structure comprises a metal line formed in the first dielectric layer, wherein the metal line is electrically coupled to the metal pad, a bump formed over the metal line, wherein the bump includes a metal coating layer and a molding compound layer.

The molding compound layer is formed over the metal line, wherein the molding compound layer comprises a flat portion, and wherein a bottom portion of the bump is embedded in the flat portion and a protruding portion, and wherein a middle portion of the bump is surrounded by the protruding portion, and wherein the protruding portion of the molding compound layer and the flat portion of the molding compound layer form an angle in a range from about 10 degrees to about 60 degrees.

In accordance with an embodiment, a method comprises forming a passivation layer over a semiconductor substrate, wherein a metal pad is embedded in the passivation layer and exposed through an opening of the passivation layer, depositing a first polymer layer on the passivation layer, forming a redistribution layer over the first polymer layer, mounting a bump over the redistribution layer and electrically coupled to the redistribution layer, forming a liquid molding compound layer over the passivation layer, wherein the bump is embedded in the liquid molding compound layer and pressing the liquid molding compound layer until a portion of a release film is lower than a top surface of the bump.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
a passivation layer formed over a semiconductor substrate;
a connection pad enclosed by the passivation layer;
a redistribution layer formed over the passivation layer, wherein the redistribution layer is directly connected to the connection pad, the redistribution layer being a topmost metallization layer;
a bump directly connected to the redistribution layer, the bump being a sphere, the bump physically contacting the redistribution layer from a first contact edge of the bump to a second contact edge of the bump, the second contact edge being opposite the first contact edge, the redistribution layer having a planar top surface extending from the first contact edge of the bump to the second contact edge of the bump, wherein the bump comprises:
a solder ball;
a metal coating layer formed over the solder ball, the metal coating layer having a thickness in a range from about 2 um to about 20 um; and
a solder layer formed over the metal coating layer, the solder layer physically contacting the redistribution layer; and
a molding compound layer formed over the redistribution layer, wherein the molding compound layer comprises:
a flat portion, and wherein a bottom portion of the bump is embedded in the flat portion of the molding compound layer; and
a protruding portion, and wherein a middle portion of the bump is surrounded by the protruding portion of the molding compound layer, and wherein the protruding portion of the molding compound layer and the flat portion of the molding compound layer form an angle in a range from about 10 degrees to about 60 degrees.

2. The structure of claim 1, further comprising:
a first polymer layer formed between the passivation layer and the redistribution layer.

3. The structure of claim 1, further comprising:
a second polymer layer formed between the redistribution layer and the molding compound layer, the second polymer layer physically contacting the redistribution layer, wherein:
the bump is partially embedded in the second polymer layer, the second polymer layer physically contacting the bump.

4. The structure of claim 1, wherein:
the metal coating layer is a copper coating layer.

5. The structure of claim 1, wherein:
the flat portion of the molding compound layer is of a thickness in a range from about 50 um to about 350 um.

6. A method comprising:
forming a passivation layer over a semiconductor substrate, wherein a metal pad is embedded in the passivation layer and exposed through an opening of the passivation layer;
depositing a first polymer layer on the passivation layer;
forming a redistribution layer over the first polymer layer;
mounting a bump over the redistribution layer and electrically coupled to the redistribution layer;
forming a liquid molding compound layer over the passivation layer, wherein the bump is embedded in the liquid molding compound layer; and
pressing the liquid molding compound layer until a portion of a release film is lower than a top surface of the bump.

7. The method of claim 6, further comprising:
curing the liquid molding compound layer to form a molding compound layer.

8. The method of claim 6, further comprising:
depositing a second polymer layer over the passivation layer;
applying a patterning process to the second polymer layer to form an opening;
forming a seed layer over the opening;
forming an under bump metallization structure over the seed layer; and
mounting the bump over the under bump metallization structure.

9. The method of claim 6, further comprising:
mounting the bump on the redistribution layer through a first reflow process.

10. The method of claim 6, further comprising:
bonding the semiconductor substrate on a packaging substrate through a second flow process, wherein the bump and a pad on the packaging substrate form a joint structure.

11. The method of claim 10, wherein:
a ratio of a diameter of the bump to a length of the pad is in a range from about 1 to about 1. 2.

12. The method of claim 6, wherein:
the bump is a solder ball comprising a copper coating layer.

13. A device comprising:
an interconnect structure over a substrate;
a passivation layer over the interconnect structure, wherein a metal pad is embedded in the passivation layer and exposed through an opening of the passivation layer;
a first dielectric layer formed over the passivation layer;
a post passivation interconnect structure formed in the first dielectric layer, wherein the post passivation interconnect structure is directly connected to the metal pad;
a bump directly mounted to the post passivation interconnect structure, the bump being a sphere, wherein the bump comprises:
a solder ball;
a metal coating layer formed over the solder ball, the metal coating layer having a thickness in a range from about 2 um to about 20 um; and a solder layer formed over the metal coating layer, the solder layer physically contacting the post passivation interconnect structure, the post passivation interconnect structure contacting the solder layer having a first material composition, the post passivation interconnect structure in the first dielectric layer having the first material composition;

a second dielectric layer physically contacting the post passivation interconnect structure and the first dielectric layer, the second dielectric layer surrounding and physically contacting a lower portion of the bump;

a molding compound layer formed over the second dielectric layer, wherein the molding compound layer comprises:
  a flat portion, and wherein a bottom portion of the bump is embedded in the flat portion; and
  a protruding portion, and wherein a middle portion of the bump is surrounded by the protruding portion , and wherein the protruding portion of the molding compound layer and the flat portion of the molding compound layer form an angle in a range from about 10 degrees to about 60 degrees.

14. The device of claim 13, wherein:
the interconnect structure comprises a plurality of metallization layers formed between the substrate and the metal pad.

15. The device of claim 14, wherein:
a top metal line of a top metallization layer is electrically coupled to the metal pad.

16. The device of claim 13, wherein:
the first dielectric layer is a first polymer layer comprising PBO.

17. A method comprising:
forming a passivation layer over a semiconductor substrate, wherein a metal pad is embedded in the passivation layer and exposed through an opening of the passivation layer;

depositing a first polymer layer on the passivation layer;

forming a redistribution layer over the first polymer layer;

mounting a bump over the redistribution layer and electrically coupled to the redistribution layer;

forming a molding compound layer over the passivation layer, wherein the bump is embedded in the molding compound layer; and pressing the molding compound layer until a portion of a release film is lower than a top surface of the bump, wherein after the pressing the molding compound layer, the molding compound layer has a protruding portion proximate and surrounding the bump, the protruding portion being surrounding by a flat portion of the molding compound layer.

18. The method of claim 17, further comprising:
curing the molding compound layer.

19. The method of claim 17, wherein the protruding portion of the molding compound layer and the flat portion of the molding compound layer form an angle in a range from about 10 degrees to about 60 degrees.

20. The method of claim 17 further comprising:
removing the release film from the bump, wherein after the removing the release film, a portion of the bump is exposed through the protruding portion of the molding compound layer.

21. The method of claim 17, wherein the bump further comprises:
  a solder ball;
  a metal coating layer formed over the solder ball, the metal coating layer having a thickness in a range from about 2 um to about 20 um; and
  a solder layer formed over the metal coating layer.

* * * * *